(12) United States Patent
Karg et al.

(10) Patent No.: US 7,723,714 B2
(45) Date of Patent: May 25, 2010

(54) PROGRAMMABLE-RESISTANCE MEMORY CELL

(75) Inventors: Siegfried F. Karg, Adliswil (CH); Gerhard Ingmar Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 325 days.

(21) Appl. No.: 11/961,593

(22) Filed: Dec. 20, 2007

(65) Prior Publication Data
US 2008/0149911 A1 Jun. 26, 2008

(30) Foreign Application Priority Data
Dec. 21, 2006 (EP) .................. 06126936

(51) Int. Cl.
*H01L 45/00* (2006.01)
(52) U.S. Cl. .................. 257/3; 257/E45.002; 438/104
(58) Field of Classification Search .................. None
See application file for complete search history.

(56) References Cited
U.S. PATENT DOCUMENTS 6,815,744 B1    11/2004   Beck
7,130,212 B2    10/2006   Bednorz
2006/0171200 A1*  8/2006  Rinerson et al. ......... 365/185.1
2007/0138463 A1*  6/2007  Herlogsson et al. ........... 257/40
2007/0284610 A1* 12/2007  Kawaura et al. ............ 257/146
2008/0001172 A1*  1/2008  Karg et al. .................. 257/194
2008/0078985 A1*  4/2008  Meyer et al. .................... 257/6

* cited by examiner

*Primary Examiner*—Sue Purvis
*Assistant Examiner*—Benjamin P Sandvik
(74) *Attorney, Agent, or Firm*—Kenneth R. Corsello; Anne Vachon Dougherty

(57) ABSTRACT

A memory cell (10) comprising at least a source electrode ($M_S$) formed on a substrate (6); at least a drain electrode ($M_D$) formed on the substrate (6); at least a coupling layer (1) formed between the source electrode ($M_S$) and the drain electrode ($M_D$), and at least a gate electrode ($M_G$) formed on the substrate (6), wherein the coupling layer (1) comprises a transition-metal oxide exhibiting a filling-controlled metal-insulator transition property; the gate electrode ($M_G$) comprises an oxygen ion conductor layer (2), and the gate electrode ($M_G$) is arranged relative to the coupling layer (1) such that application of an electrical signal to the gate electrode ($M_G$) causes alteration of the oxygen vacancy (3) concentration in the coupling layer (1).

8 Claims, 3 Drawing Sheets

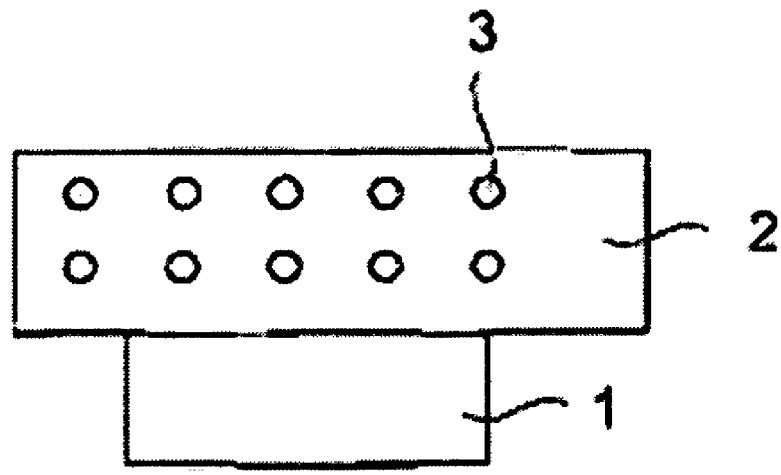
OFF STATE
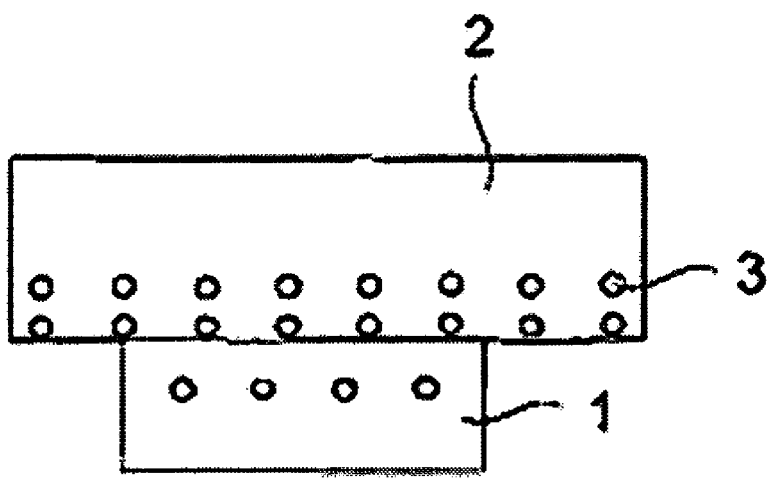
ON STATE

PROGRAMMABLE-RESISTANCE MEMORY CELL

FIELD OF THE INVENTION

The present invention relates to a programmable-resistance memory cell, a method of fabrication therefor and a non-volatile memory device incorporating such a memory cell.

BACKGROUND OF THE INVENTION

For memory devices and for numerous other applications, bi-stable devices or circuits are used. For example, for storing one bit of information in a memory, a bi-stable device can be used which is switchable between at least two different and persistent states. When writing a logical "1" into the device, it is driven into one of the two persistent states and when writing a logical "0", or erasing the logical "1", the device is driven into the other of the two different states. Each of the states persists until a next step of writing information into the device or erasing information in the device proceeds.

Flash erasable programmable read only memory (FEPROM, also referred to as flash memory) is used in semiconductor devices and provides for rapid block erase operations. Typically, flash memory only uses one transistor per memory cell versus the two transistors per memory cell for known electrically erasable programmable read only memory (EEPROM). Thus, flash memory takes up less space on a semiconductor device and is less expensive to produce than EEPROM. Nevertheless, the development of further space-saving components of semiconductor devices and cost-efficient fabrication techniques for producing such devices continues.

To that end, the use of materials with bi-stable electrical resistance for semiconductor device applications has been studied. The resistance states of the material can be changed reversibly by applying appropriate electrical signals to the material. These electrical signals should be larger than a given threshold $V_T$ and longer than a given time t. The resistance state of the material can be read or analysed by applying other signals which are non-destructive to the conductivity state if they are much smaller than $V_T$.

Transition-metal oxides are one class of materials that can be conditioned such that they exhibit the desired bi-stable electrical resistance. Non-volatile two-terminal memory devices based on transition-metal oxides have been disclosed. An example of such a device is given in U.S. Pat. No. 6,815,744. An example of a three-terminal memory device has been given in U.S. Pat. No. 7,130,212B2.

The conditioning process that the transition-metal oxides are subjected to in order that the switching between the resistance states may be done comprises subjecting the transition-metal oxide to an appropriate electrical signal for a sufficient period of time, this being done via electrical signals applied to the electrodes contacting the transition-metal oxide layer as discussed above. The conditioning process generates a confined conductive region in the transition-metal oxide that can be reversibly switched between two or more resistance states.

Some of the drawbacks of the above-described devices are associated with the conditioning process. This is because, not only is the conditioning process time-consuming, it is required per cell incorporated in such a device. Furthermore, the confined conductive region that is generated by the conditioning process occurs at an arbitrary position in the dielectric material, i.e., the position of the conducting path is not controllable by well-defined process parameters. This may cause a large variation in the electrical properties of such devices, that are otherwise nominally identical, to be observed.

Accordingly, it is desirable to provide a programmable resistance memory cell that mitigates and/or obviates the drawbacks associated to known programmable resistance memory cells.

SUMMARY OF THE INVENTION

According to an embodiment of a first aspect of the present invention, there is provided a memory cell comprising: at least a source electrode formed on a substrate; at least a drain electrode formed on the substrate; at least a coupling layer between the source electrode and the drain electrode, and at least a gate electrode formed on the substrate, wherein: the coupling layer comprises a transition-metal oxide exhibiting a filling-controlled metal-insulator transition property; the gate electrode comprises an oxygen-ion conductor layer, and the gate electrode is arranged relative to the coupling layer such that application of an electrical signal to the gate electrode causes alteration of an oxygen vacancy concentration in the coupling layer. In an embodiment of the present invention, the electrical signal that is applied to the gate electrode causes oxygen vacancies to migrate into the coupling layer from the oxygen-ion conductor layer. This changes the formal oxidation state of the transition-metal ion in the transition-metal oxide and concomitantly the filling of the transition metal band. Thus, the coupling layer is transformed from having substantially insulating properties to a conductor and vice versa when an electrical signal is applied to the gate electrode. Thus, in an embodiment of the present invention, the resistance of the coupling layer is reversibly switchable between at least two different and persistent resistance states by the application of the electrical signal to the gate electrode. More particularly, resistance switching may be achieved in an embodiment of the present invention without initiation of a conditioning process as for previously-proposed devices and so does not suffer from the above-discussed drawbacks associated to the conditioning process. Furthermore, the resistance state of the coupling layer that is set by the application of an electrical signal to the gate electrode persists until the application of an electrical signal to the gate electrode again, i.e. the electrical signal need not be applied continuously to the gate electrode for a set and desired resistance set to persist and so an embodiment of the present invention offers the advantage of lower operating power than previously-proposed devices. A further advantage associated to an embodiment of the present invention is that multi-level, multi-bit, storage per cell is possible.

Preferably, the oxygen-ion conductor layer comprises a material exhibiting an oxygen vacancy mobility of at least $10^{-9}$ cm$^2$/Vs. Selection of the material of the oxygen-ion conductor layer to exhibit an oxygen vacancy mobility that is high, i.e. at least $10^{-9}$ cm$^2$/Vs, is reflected in the reduced time for oxygen vacancies to migrate from the oxygen-ion conductor layer into the coupling layer, and, therefore, in the switching of the resistance state of the coupling layer from an off state, when it is substantially insulating, to an on state in which it conducts current, or vice versa, when an electrical signal is applied to the gate electrode.

Desirably, the arrangement of the gate electrode relative to the coupling layer is such that the oxygen-ion conductor layer is formed on the coupling layer. In this case, since the oxygen-ion conductor layer is formed directly on the coupling layer, the migration of oxygen vacancies into the coupling layer is aided.

Desirably, the gate electrode further comprises a blocking layer, which is formed on the oxygen-ion conductor layer, the blocking layer comprising a material that is impermeable and/or chemically inert to oxygen. Since the material of the blocking layer is chosen to be impermeable and/or chemically inert to oxygen, the oxygen vacancies are channeled substantially in the direction of the coupling layer, where they contribute to the resistance switching of the coupling layer.

Preferably, the oxygen-ion conductor layer comprises one of: a fluorite-type oxide, a perovskite with intrinsic and/or extrinsic vacancies, an Aurivillius-type oxide, and a pyrochlore. Specific examples of materials for the oxygen-ion conductor layer include: fluorite-type oxides with extrinsic oxide-ion vacancies such as yttrium- and/or scandium-stabilized zirconia $(ZrO_2)_{1-x}((Y,Sc)_2O_3)_x$ with x=0 to 0.9, gadolinium-doped ceria $(Ce,Gd)O_{2-x}$ with x=0 to 0.5, perovskites with intrinsic and/or extrinsic vacancies such as lanthanum strontium gallium magnesium oxide $(La,Sr)(Ga,Mg)O_{3-x}$ with x=0 to 0.5, barium indium oxide $BaInO_{3-x}$ with x=0 to 0.5, lithium lanthanum titanium oxide $(Li,La)TiO_{3-x}$ with x=0 to 0.5, Aurivillius-type oxides such as bismuth vanadium titanium copper oxide $Bi_4(V,Ti,Cu)_2O_{11-x}$ with x=0 to 2, pyrochlores such as gadolinium zirconium titanium oxide $Gd_2(Zr,Ti)_2O_7$, and oxides such as lanthanum molybdenum oxide $La_2Mo_2O_9$.

Desirably, the transition-metal oxide comprises: vanadium and/or chromium oxide, nickel oxide, strontium titanium oxide, lanthanum titanium oxide, yttrium and/or calcium titanium oxide, lanthanum and/or strontium manganese oxide, or praseodymium and/or calcium manganese oxide. Examples of materials in this regard include: a perovskite such as strontium titanium oxide $SrTiO_{3-x}$ with x=0 to 0.5, lanthanum titanium oxide $LaTiO_{3+x}$ with x=0 to 0.2, yttrium calcium titanium oxide $(Y,Ca)TiO_{3-x}$ with x=0 to 0.5, lanthanum strontium manganese oxide $(La,Sr)MnO_{3-x}$ with x=0 to 0.5, praseodymium calcium manganese oxide $(Pr,Ca)MnO_3$, a corundum such as vanadium chromium oxide $(V,Cr)_2O_{3-x}$, or nickel oxide $NiO_x$ with x=0.8 to 1.

According to an embodiment of a second aspect of the present invention, there is provided a non-volatile memory device comprising at least one memory cell according to an embodiment of the first aspect of the present invention. The advantageous features and/or properties of a memory cell as above-described are also displayed by a non-volatile memory device incorporating such a memory cell.

Corresponding method aspects are also provided and so according to an embodiment of a third aspect of the present invention there is provided a method for fabricating a memory cell comprising the steps of: forming at least a source electrode on a substrate; forming at least a drain electrode on the substrate; forming at least a coupling layer between the source electrode and the drain electrode, and forming at least a gate electrode on the substrate, wherein: in the step of forming the coupling layer, the material of the coupling layer is selected to comprise a transition-metal oxide exhibiting a filling-controlled metal-insulator transition property; in the step of forming the gate electrode, the gate electrode is formed so as to comprise an oxygen-ion conductor layer, and the gate electrode is arranged relative to the coupling layer such that application of an electrical signal to the gate electrode causes alteration of an oxygen vacancy concentration in the coupling layer.

Any of the device features may be applied to the method aspect of the invention and vice versa. Features of one aspect of the invention may be applied to another aspect of the invention. Any disclosed embodiment may be combined with one or several of the other embodiments shown and/or described. This is also possible for one or more features of the embodiments.

BRIEF DESCRIPTION OF THE DRAWINGS

Reference will now be made, by way of example, to the accompanying drawings, in which:

FIGS. 2A and 2B schematically illustrate the principle of an embodiment of the present invention, and FIG. 3 schematically illustrates an embodiment of the method aspect of the present invention.

DETAILED DESCRIPTION OF PREFERRED EMBODIMENTS

Figure 1:
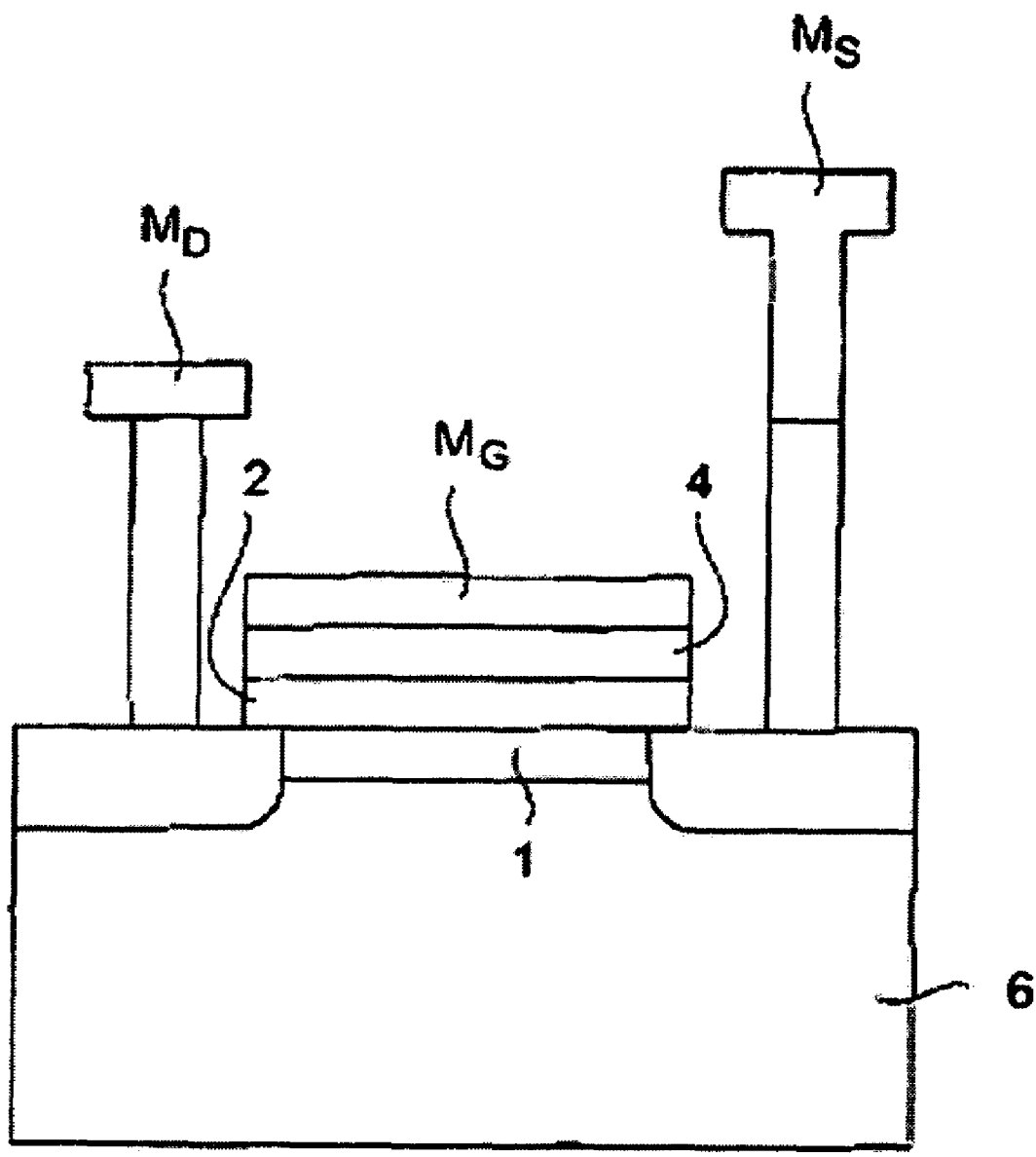
FIG. 1 schematically illustrates an embodiment of the present invention.

Within the description, the same reference numerals or signs have been used to denote the same parts or the like.

Reference is now made to FIG. 1, which schematically illustrates an embodiment of the present invention. As can be seen from FIG. 1, in an embodiment of the present invention, there is provided a memory cell 10 with three terminals: a source electrode $M_S$, a drain electrode $M_D$ and a gate electrode $M_G$ all of which are formed on a substrate 6. The substrate 6 may, for example, pertain to CMOS technology and be made of silicon-dioxide $(SiO_2)$. The source electrode $M_S$ and the drain electrode $M_D$, which are shown as being arranged laterally relative to each other, are connected by a coupling layer 1, which is chosen to comprise a transition-metal oxide exhibiting a filling-controlled metal-insulator transition property. The gate electrode $M_G$ is formed so as to comprise an oxygen-ion conductor layer 2. By oxygen-ion conductor layer, it is meant that such a layer comprises a material that is capable of storing and/or conducting oxygen ions. The gate electrode $M_G$ is arranged relative to the coupling layer 1 such that the application of an electrical signal to the gate electrode $M_G$ with respect to the source electrode $M_S$ causes the migration of oxygen ions from the oxygen-ion conductor layer 2 into the coupling layer 1 and vice versa. The electrical signal that is applied to the gate electrode $M_G$ causes oxygen vacancies 3 to migrate into the coupling layer 1 from the oxygen-ion conductor layer 2. This changes the formal oxidation state of the transition-metal ion in the transition-metal oxide and concomitantly the filling of the transition metal band. Thus, the coupling layer 1 is transformed from having substantially insulating properties to a conductor or vice versa when an electrical signal is applied to the gate electrode. This transformation may be probed by, for example, applying an electrical potential between the source electrode $M_S$ and drain electrode $M_D$ and measuring the magnitude of current therebetween. Thus, in an embodiment of the present invention, the resistance of the coupling layer 1 is reversibly switchable between at least two different and persistent resistance states by the application of the electrical signal to the gate electrode $M_G$. More particularly, resistance switching may be achieved in an embodiment of the present invention without initiation of a conditioning process as for previously-proposed devices and so does not suffer from the drawbacks associated to the conditioning process.

Reference is now made to FIGS. 2A and 2B, which schematically illustrate the principle of an embodiment of the present invention. FIG. 2A depicts the scenario when the coupling layer 1 is in an off state, i.e. it has substantially insulating properties. FIG. 2B depicts the scenario when an electrical signal is applied to the gate electrode $M_G$. As can be clearly seen from FIG. 2B, this causes the migration of oxygen vacancies 3 from the oxygen-ion conductor layer 2 into the coupling layer 1. This changes the formal oxidation state of the transition-metal ion in the transition-metal oxide and concomitantly the filling of the transition metal band, which causes switching of the properties of the coupling layer 1 from being insulating to conducting. Of course, the reverse can also be done in that, the coupling layer can be switched from an on state to an off state for an appropriate choice of material for the coupling layer 1, when an electrical signal is applied to the gate electrode. In this way, the resistance state of the coupling layer 1 can be switched. For the switching of the coupling layer 1 from the off to the on state, or vice versa, to be of reduced duration, the oxygen-ion conductor layer 2 is chosen so as to comprise a material exhibiting an oxygen vacancy 3 mobility that is high, i.e. of at least $10^{-9}$ cm$^2$/Vs.

In order to aid channeling of the oxygen vacancies 3 into the coupling layer 1, the gate electrode $M_G$ is, in an embodiment of the present invention, provided with the extra feature that it comprises a blocking layer 4 that is formed on the oxygen-ion conductor layer 2, in a perpendicular direction away from the surface of the coupling layer 1. The material of the blocking layer 4 is chosen to be impermeable and/or chemically inert to oxygen. Thus, the oxygen vacancies 3 are channeled substantially in the direction of the coupling layer 1, where they contribute to the resistance switching thereof, rather than being lost by migration into other regions of the gate electrode $M_G$.

In FIG. 1, it is shown that the gate electrode $M_G$ is arranged relative to the coupling layer 1 such that the oxygen-ion conductor layer 2 is formed on the coupling layer 1, i.e. the gate electrode $M_G$ is laterally disposed between the source electrode $M_S$ and the drain electrode $M_D$. An embodiment of the present invention is, of course, not limited to this arrangement of the gate electrode $M_G$, and, in fact, the present invention encompasses all those arrangements of the gate electrode $M_G$ relative to the coupling layer 1 that allow the migration of oxygen vacancies 3 into the coupling layer 1 from the oxygen-ion conductor layer 2 when an electrical signal is applied to the gate electrode $M_G$.

In an embodiment of the present invention, the oxygen-ion conductor layer 2 is selected to comprise fluorite-type oxides with extrinsic oxide-ion vacancies such as yttrium- and/or scandium-stabilized zirconia $(ZrO_2)_{1-x}((Y,Sc)_2O_3)_x$ with x=0 to 0.9 or gadolinium-doped ceria $(Ce,Gd)O_{2-x}$ with x=0 to 0.5. Alternatively, perovskites with intrinsic and/or extrinsic vacancies such as lanthanum strontium gallium magnesium oxide $(La,Sr)(Ga,Mg)O_{3-x}$ with x=0 to 0.5, barium indium oxide $BaInO_{3-x}$ with x=0 to 0.5, lithium lanthanum titanium oxide $(Li,La)TiO_{3-x}$ with x=0 to 0.5, Aurivillius-type oxides such as bismuth vanadium titanium copper oxide $Bi_4(V,Ti,Cu)_2O_{11-x}$ with x=0 to 2, pyrochlores such as gadolinium zirconium titanium oxide $Gd_2(Zr,Ti)_2O_7$, and oxides like lanthanum molybdenum oxide $La_2Mo_2O_9$ may be used.

For the transition-metal oxide in the coupling layer 1, perovskites such as $(La, Sr)MO_{3-x}$ where M is a 3d transition-metal element and x=0 to 0.5 are chosen because of their dependence of the room-temperature resistance on the oxygen stoichiometry. The parent perovskite compounds, $LaMO_3$ and $SrMO_3$ are Mott or charge-transfer insulators, and upon changing the band-filling, for example, associated with oxygen vacancies 3, a metallic state is obtained.

Other examples of transition-metal oxides that can be used in the coupling layer 1 include perovskites such as strontium titanium oxide $SrTiO_{3-x}$ with x=0 to 0.5, lanthanum titanium oxide $LaTiO_{3-x}$ with x=0 to 0.2, yttrium calcium titanium oxide $(Y,Ca)TiO_{3-x}$ with x=0 to 0.5, praseodymium calcium manganese oxide $(Pr,Ca)MnO_3$, corundum such as vanadium chromium oxide $(V,Cr)_2O_{3-x}$, or nickel oxide $NiO_x$ with x=0.8 to 1.

The present invention also extends to a non-volatile memory device comprising at least one memory cell 10 according to an embodiment of the present invention and as described above.

Figure 3:
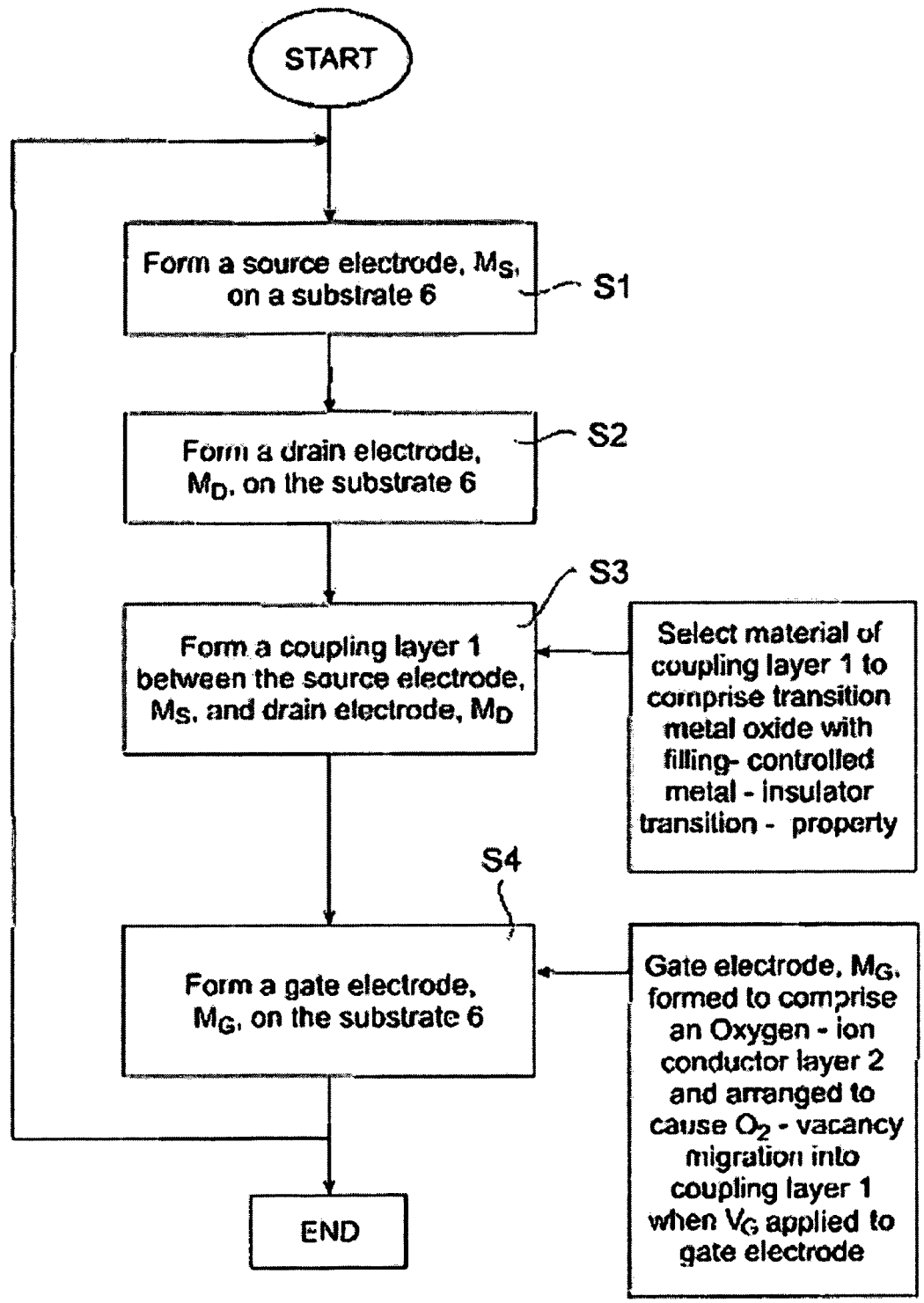

Reference is now made to FIG. 3, which schematically illustrates a method according to an embodiment of the present invention. In a step S1, at least a source electrode $M_S$ is formed on a substrate 6. In a step S2, a drain electrode $M_D$ is formed on the substrate 6. In a step S3, a coupling layer 1 is formed between the source electrode $M_S$ and the drain electrode $M_D$. In a step S4, a gate electrode $M_G$ is formed on the substrate 6. In the step of forming the coupling layer 1, i.e. in step S3, the material of the coupling layer 1 is selected to comprise a transition-metal oxide exhibiting a filling-controlled metal-insulator transition property. In the step of forming the gate electrode $M_G$, i.e. step S4, the gate electrode $M_G$ is formed so as to comprise an oxygen-ion conductor layer 2, and the gate electrode $M_G$ is arranged relative to the coupling layer 1 such that application of an electrical signal to the gate electrode $M_G$ causes alteration of an oxygen vacancy 3 concentration in the coupling layer 1.

A method according to an embodiment of the present invention is not limited to being performed once, i.e. after the completion of step S4, the process may loop back to the start of the method and steps S1 to S4 may be performed iteratively, thereby to produce multiple layers of memory cells according to an embodiment of the present invention. Any of the steps S1 or S4 can be performed in parallel or without maintaining a strict order of sequence. Any suitable technique known to a skilled person can be used for any of these steps. The method described with reference to FIG. 4 can be supplemented with further steps corresponding to features in a memory cell according to an embodiment of the present invention as described above.

Some of the advantages offered by an embodiment of the present invention as discussed above over FEPROM devices include: scalability, multilevel storage per cell, RAM capability and CMOS compatibility. In an embodiment of the present invention, a bipolar voltage is not used—this is in contrast to known two-terminal devices where, due to such a feature, the incorporation of a diode in series poses a problem.

In an embodiment of the present invention, the resistance state of the coupling layer 1 persists, i.e. remains stable until it is switched by the application of an electrical signal to the gate electrode $M_G$.

The present invention has been described above purely by way of example and modifications of detail can be made within the scope of the invention.

Each feature disclosed in the description, and, where appropriate, the claims and the drawings may be provided independently or in any appropriate combination.

The invention claimed is:

1. A memory cell comprising:
   at least a source electrode ($M_S$) formed on a substrate;
   at least a drain electrode ($M_D$) formed on the substrate;
   at least a coupling layer between the source electrode ($M_S$) and the drain electrode ($M_D$), and
   at least a gate electrode ($M_G$) formed on the substrate,
   wherein:
   the coupling layer comprises a transition-metal oxide exhibiting a filling-controlled metal-insulator transition property;
   the gate electrode ($M_G$) comprises an oxygen-ion conductor layer, and the gate electrode ($M_G$) is arranged relative to the coupling layer such that application of an electrical signal to the gate electrode ($M_G$) causes alteration of an oxygen vacancy concentration in the coupling layer.

2. A memory cell as claimed in claim 1 wherein the oxygen-ion conductor layer comprises a material exhibiting an oxygen vacancy mobility of at least $10^{-9}$ cm$^2$/Vs.

3. A memory cell as claimed in claim 1 wherein the arrangement of the gate electrode ($M_G$) relative to the coupling layer is such that the oxygen-ion conductor layer is formed on the coupling layer.

4. A memory cell as claimed in claim 1 wherein the gate electrode ($M_G$) further comprises a blocking layer, which is formed on the oxygen-ion conductor layer, the blocking layer comprising a material that is at least one of impermeable and chemically inert to oxygen.

5. A memory cell as claimed in claim 1 wherein the oxygen-ion conductor layer comprises one of: a fluorite-type oxide, a perovskite with intrinsic and/or extrinsic vacancies, an Aurivillius-type oxide, and a pyrochlore.

6. A memory cell as claimed in claim 1 wherein the transition-metal oxide comprises: vanadium and/or chromium oxide, nickel oxide, strontium titanium oxide, lanthanum titanium oxide, yttrium and/or calcium titanium oxide, lanthanum and/or strontium manganese oxide, or praseodymium and/or calcium manganese oxide.

7. A non-volatile memory device comprising at least one memory cell comprising:
   at least a source electrode ($M_S$) formed on a substrate;
   at least a drain electrode ($M_D$) formed on the substrate;
   at least a coupling layer between the source electrode ($M_S$) and the drain electrode ($M_D$), and
   at least a gate electrode ($M_G$) formed on the substrate, wherein:
   the coupling layer comprises a transition-metal oxide exhibiting a filling-controlled metal-insulator transition property;
   the gate electrode ($M_G$) comprises an oxygen-ion conductor layer, and
   the gate electrode ($M_G$) is arranged relative to the coupling layer such that application of an electrical signal to the gate electrode ($M_G$) causes alteration of an oxygen vacancy concentration in the coupling layer.

8. A method for fabricating a memory cell comprising the steps of:
   forming at least a source electrode ($M_S$) on a substrate;
   forming at least a drain electrode ($M_D$) on the substrate;
   forming at least a coupling layer between the source electrode ($M_S$) and the drain electrode ($M_D$), and
   forming at least a gate electrode ($M_G$) on the substrate, wherein:
   in the step of forming the coupling layer, the material of the coupling layer is selected to comprise a transition-metal oxide exhibiting a filling-controlled metal-insulator transition property, and
   in the step of forming the gate electrode ($M_G$), the gate electrode ($M_G$) is formed so as to comprise an oxygen-ion conductor layer, and the gate electrode ($M_G$) is arranged relative to the coupling layer such that application of an electrical signal to the gate electrode ($M_G$) causes alteration of an oxygen vacancy concentration in the coupling layer.

* * * * *